(12) United States Patent
Jiang et al.

(10) Patent No.: US 9,245,835 B1
(45) Date of Patent: Jan. 26, 2016

(54) INTEGRATED CIRCUIT PACKAGE WITH REDUCED PAD CAPACITANCE

(71) Applicant: Altera Corporation, San Jose, CA (US)

(72) Inventors: Xiaohong Jiang, San Jose, CA (US); Hong Shi, Fremont, CA (US)

(73) Assignee: Altera Corporation, San Jose, CA (US)

( * ) Notice: Subject to any disclaimer, the term of this patent is extended or adjusted under 35 U.S.C. 154(b) by 38 days.

(21) Appl. No.: 13/955,849

(22) Filed: Jul. 31, 2013

(51) Int. Cl.
  *H01L 23/48* (2006.01)
  *H01L 23/498* (2006.01)
  *H01L 21/768* (2006.01)

(52) U.S. Cl.
  CPC .... *H01L 23/49816* (2013.01); *H01L 21/76895* (2013.01)

(58) Field of Classification Search
  CPC ............ H01L 24/01; H01L 2223/54486; H01L 2224/01; H01L 2224/0233–2224/03001
  See application file for complete search history.

(56) References Cited

U.S. PATENT DOCUMENTS

| | | | |
|---|---|---|---|
| 5,966,803 A | 10/1999 | Wilson | |
| 6,613,413 B1 * | 9/2003 | Japp | H05K 3/38 174/255 |
| 7,897,880 B1 * | 3/2011 | Goergen | H05K 1/0237 174/261 |
| 8,381,962 B2 | 2/2013 | Gruber et al. | |
| 8,446,707 B1 | 5/2013 | Das et al. | |
| 2002/0180004 A1 * | 12/2002 | Oggioni et al. | 257/621 |
| 2009/0133913 A1 * | 5/2009 | Kushta | H01L 23/49827 174/260 |
| 2013/0140344 A1 | 6/2013 | Xu | |

FOREIGN PATENT DOCUMENTS

WO   9966599   12/1999

* cited by examiner

*Primary Examiner* — David Vu
*Assistant Examiner* — Cuong Nguyen
(74) *Attorney, Agent, or Firm* — Treyz Law Group; Jason Tsai (57) ABSTRACT

An integrated circuit package having a package substrate, an integrated circuit, and at least one solder ball is provided. The package substrate has first and second surfaces. The integrated circuit may be mounted on the first surface of the package substrate. The solder ball may be coupled to the second surface of the package substrate. The package substrate may include a substrate layer. The substrate layer may include a ground plane with an opening. The opening may be formed just above the solder ball. In one instance, the diameter of the opening is greater than the diameter of the solder ball pad.

19 Claims, 8 Drawing Sheets

INTEGRATED CIRCUIT PACKAGE WITH REDUCED PAD CAPACITANCE

BACKGROUND

Signal speed requirements of an integrated circuit package keep increasing with every new generation of integrated circuit packages. Generally, an integrated circuit package includes an integrated circuit die and a package substrate. The integrated circuit die is generally capable of satisfying its input-output speed requirements. However, the slow advancement in packaging technology places a limitation on the signal transmission speed of the integrated circuit package.

One of the known causes that may limit the signal transmission speed through a package substrate is capacitive coupling between the solder ball pads and a ground plane in the package substrate. For instance, when a signal is being transmitted through a solder ball pad, there may be an electric field fringing towards the ground plane. The fringing electric field may attract electrical charge on the ground plane to get concentrated in one location. The concentrated electrical charge in one location may produce parasitic capacitance that affects the signal being transmitted (i.e., the parasitic capacitance may degrade the electrical performance of the signal being transmitted). For example, the resultant signal may have a small signal bandwidth and a poor insertion/return loss at high frequencies.

It is within this context that the embodiments described herein arise.

SUMMARY

Embodiments described herein include an integrated circuit package having an opening in a ground plane and a method of manufacturing the integrated circuit package. It should be appreciated that the embodiments can be implemented in numerous ways, such as a process, an apparatus, a system, a device, or a method. Several embodiments are described below.

In one embodiment, an integrated circuit package with a package substrate, an integrated circuit, and at least one solder ball is disclosed. The package substrate has first and second surfaces. The integrated circuit may be mounted on the first surface of the package substrate. The solder ball may be coupled to the second surface of the package substrate. The package substrate may include a substrate layer. The substrate layer may include a ground plane with an opening. The opening may be formed just above the solder ball. In one instance, the diameter of the opening may be greater than the diameter of the solder ball.

In another embodiment, an integrated circuit package similar to the above embodiment is disclosed. However, in this embodiment, the integrated circuit package may further include a spiral coil structure that is formed within the opening. The spiral coil structure may be coupled in series between the integrated circuit and the solder ball.

In an alternative embodiment, a method of manufacturing an integrated circuit package is disclosed. The method includes forming a ground plane in the package substrate, forming a solder pad region on a second surface of the package substrate, and removing a portion of the ground plane. In one instance, the removed portion may substantially overlap with at least half of the solder pad region.

Further features of the invention, its nature and various advantages will be more apparent from the accompanying drawings and the following detailed description of the preferred embodiments.

DETAILED DESCRIPTION

The following embodiments describe an integrated circuit package having an opening in a ground plane and a method to manufacture the integrated circuit package. It will be obvious, however, to one skilled in the art, that the present exemplary embodiments may be practiced without some or all of these specific details. In other instances, well-known operations have not been described in detail in order not to unnecessarily obscure the present embodiments.

Figure 1:
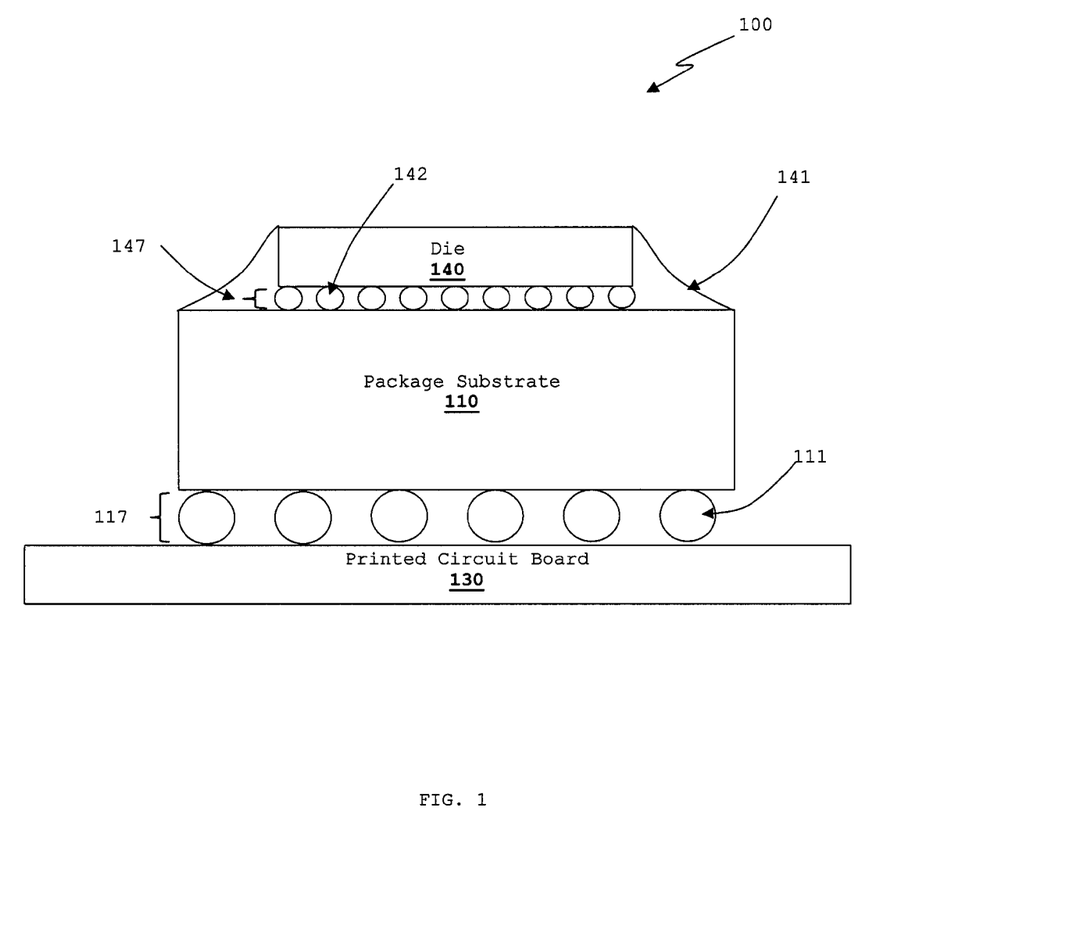
FIG. 1 shows an illustrative integrated circuit package mounted on a printed circuit board (PCB) in accordance with one embodiment of the present invention.

FIG. 1, meant to be illustrative and not limiting, shows an integrated circuit package 100 mounted on a printed circuit board (PCB) 130 in accordance with one embodiment of the present invention. Integrated circuit package 100 includes die 140, which forms the upper portion of integrated circuit package 100, and package substrate 110, which forms the lower portion of integrated circuit package 100. Integrated circuit package 100 may be mounted on PCB 130.

Integrated circuit package 100 may be a memory device, a programmable logic device (PLD), a microprocessor device, an application specific integrated circuit (ASIC) device or an application specific standard product (ASSP) device. Depending on the type of device integrated circuit package 100 is, integrated circuit package 100 may perform functions such as storing data, processing data or transferring data. In one embodiment, integrated circuit package 100 may be a field programmable gate array (FPGA) device. The FPGA device may perform specific logical functions based on user configuration instructions.

In FIG. 1, die 140 may be mounted on a top surface of package substrate 110. As shown in FIG. 1, a top surface of package substrate 110 may be coupled to die 140 and a bottom surface of package substrate 110 may be coupled to PCB 130. Integrated circuit package 100 may be assembled using flip-chip technology. It should be appreciated that using flip-chip technology, die 140 may be coupled to package substrate 110 via bumps 142. Alternatively, integrated circuit package 100 may be assembled using wire-bond technology. In a wire-bond package, wires (not shown) may be used to couple die 140 to package substrate 110.

In one embodiment, package substrate 110 may be a multi-layer package substrate. It should be appreciated that a multi-layer package substrate may include at least three substrate layers. Die 140 may include a complementary metal oxide semiconductor (CMOS) structure that is capable of performing digital/analog functions. Die 140 may include a plurality of circuits such as programmable logic elements, bus circuitry, memory elements, central processing unit (CPU) circuitry and/or input-output (I/O) circuitry.

Bump layer 147 below die 140 includes a plurality of bumps 142. Bumps 142 may be used to transfer signals between die 140 and package substrate 110. In one embodiment, bumps 142 may be referred to as C4 (controlled collapse chip connection) bumps. It should be appreciated that the diameter of bumps 142 may be significantly smaller than the diameter of solder balls 111. Die 140 and the top surface of package substrate 110 may be encapsulated by package laminate 141. Package laminate 141 may keep moisture and impurities out of integrated circuit package 100. It should be appreciated that moisture or impurities that enter integrated circuit package 100 may adversely affect the functionality of integrated circuit package 100.

Still referring to FIG. 1, integrated circuit package 100 may be mounted on PCB 130. Integrated circuit package 100 is coupled with PCB 130 through solder balls 111. Solder balls 111 are attached to package substrate 110 through solder ball pads. There may be a plurality of solder balls 111 in solder ball layer 117. As an example, a complex integrated circuit package 100 may have at least one hundred solder balls 111. In an FPGA device, there may be thousands of solder balls 111. In one embodiment, solder ball pads may have a diameter of 635 microns (μm). Solder balls 111 may be coupled to PCB traces or vias (not shown) on PCB 130.

Generally, the PCB traces are utilized as signal pathways to other circuits that may be mounted on PCB 130. In one instance, the PCB traces may be made of copper. Each of the solder balls 111 may be utilized to perform one of these functions: (i) transferring signals between package substrate 110 and PCB 130, (ii) receiving a power supply to power integrated circuit package 100, or (iii) providing a ground connection to integrated circuit package 100.

Signals being transferred between integrated circuit package 100 and PCB 130 may require matching impedances between the connecting signal pathways and the connected element (e.g., integrated circuit package 100 and PCB 130 impedance matches with Silicon driver/receiver terminal impedance). Having matching impedances may allow the maximum signal power strength to be transferred through the signal pathways (e.g., with minimum or almost zero reflections of the signal back to the source of the signal). In one embodiment, a differential signal transmission path has a characteristic impedance value of 100 Ohms. In such an embodiment, PCB 130 may also require an impedance value of 100 Ohms to obtain matching impedances.

Figure 2:
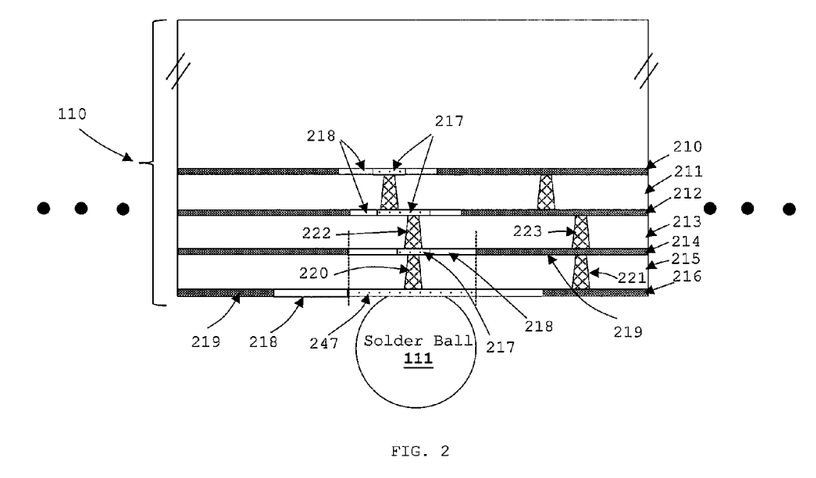
FIG. 2 shows a cross-sectional side view of an illustrative package substrate in accordance with one embodiment of the present invention.

FIG. 2, meant to be illustrative and not limiting, illustrates a cross-section of a package substrate 110 in accordance with one embodiment of the present invention. Package substrate 110 may be a multi-layered package substrate with dielectric layers 211, 213 and 215 and routing layers 210, 212 and 214. Furthermore, package substrate 110 includes package surface 216 where solder ball 111 may be attached. It should be appreciated that there may be other structures (e.g., plated through hole (PTH) vias and package traces) within package substrate 110.

Dielectric layers 211, 213 and 215, routing layers 210, 212 and 214 and package surface 216 may be arranged to form a stack structure. The term "stack" used herein may refer to a structural formation where the layers are on top of each other.

In FIG. 2, package surface 216 forms the bottom surface of package substrate 110. Routing layer 214 may be the closest routing layer to package surface 216. Routing layer 212, which is located between dielectric layers 211 and 213, may be the second closest routing layer to package surface 216. Out of the three routing layers 210, 212 and 214, routing layer 210 may be the farthest from package surface 216.

Package surface 216 includes solder ball pad 247. It should be appreciated that package surface 216 may also be known as an interfacing surface of package substrate 110. Solder ball 111 may be attached to solder ball pad 247 on package surface 216.

Routing layers 210, 212 and 214 may be utilized for routing signals between a die (e.g., die 140 of FIG. 1) and a solder ball (e.g., solder ball 111) or for routing signals between a PCB (e.g., PCB 130 of FIG. 1) and a bump located on the die (e.g., bump 142 on die 140 of FIG. 1).

Routing layers 210, 212 and 214 and package surface 216 are separated by dielectric layers 211, 213 and 215. In FIG. 2, dielectric layer 211 separates routing layer 210 from routing layer 212, dielectric layer 213 separates routing layer 212 from routing layer 214 and dielectric layer 215 separates routing layer 214 from package surface 216.

Dielectric layers 211, 213 and 215 may be substantially thicker than routing layers 210, 212 and 214 and package surface 216. For example, each of dielectric layers 211, 213 and 215 may have a thickness of 25~35 um whereas each of routing layers 210, 212 and 214 and package surface 216 may have a thickness of ~15 um. In one embodiment, routing layers 210, 212 and 214 and package surface 216 are coupled together through conductive vias 220-223. As shown in FIG. 2, conductive vias 220-223 may penetrate respective dielectric layer 211, 213 and 215. Conductive vias 220 and 221 couple routing layer 214 to package surface 216 and conductive vias 222 and 223 couple routing layer 212 to routing layer 214. Conductive vias 220-223 may be holes within the respective dielectric layers 211, 213 and 215 that are filled with conductive materials. In one embodiment, conductive vias 220-223 may include a plated through hole (PTH) structure or a micro-via structure.

It should be appreciated that dielectric layers 211, 213 and 215 for package substrate 110 may be made from low temperature co-fired ceramic (LTCC) materials or high temperature co-fired ceramic (HTCC) materials. In some instances, dielectric layers 211, 213 and 215 may be made from organic substrate materials. Ground plane 219 and signal conductors 217, on the other hand, may be formed from conductive materials (e.g., copper).

In one instance, conductive vias 220 and 222 may be utilized for transferring signals whereas conductive vias 221 and 223 may be utilized for providing ground connections. Accordingly, signals from die 140 of FIG. 1 may be transmitted through package substrate 110 using conductive vias 220 and 222. Similarly, signals from PCB 130 of FIG. 1 may be received through package substrate 110 using conductive vias 220 and 222.

Routing layers 210, 212 and 214, respectively, may further include ground plane 219, openings 218 and signal conductors 217. Openings 218 and signal conductors 217 on the respective routing layers 210, 212 and 214 may be of different shapes and sizes. For example, routing layers 210, 212 and 214 may be similar to routing layers 400, 500, 600 and 700 as shown in respective FIGS. 4A, 5A, 6A and 7A.

In FIG. 2, ground plane 219 may substantially cover each of routing layers 210, 212 and 214 and package surface 216. It should be appreciated that ground plane 219 may provide sufficient grounding for signals that are transmitted through package substrate 110. Conductive vias 221 and 223 may couple ground planes 219 on routing layers 210, 212 and 214 and package surface 216 to form a substantially large grounded area in package substrate 110.

Fringing electric fields are generated when signals transmit through solder ball pad 247. The fringing electric fields may be between solder ball pad 247 and ground plane 219 in routing layers 210, 212 and 214. The fringing electric fields may attract stray electrical charges on ground plane 219 to a specific location. The concentration of electrical charges at a specific location may be similar to the behavior of a capacitor with a specific capacitance value. In the embodiment of FIG. 2, the capacitance between solder ball pad 247 and ground plane 219 of routing layer 214 may be substantially large (e.g., up to 370 femto farad (fF)). In such scenarios, if there is no proper opening in the ground plane 219, signal transmission may be degraded.

Opening 218 is a removed portion of ground plane 219. In the embodiment of FIG. 2, there is one opening 218 in each routing layer 210, 212 and 214. It should be appreciated that there may be more than one opening 218 in ground plane 219, depending on design requirements. In one instance, the number of openings 218 may be proportional to the number of conductive vias 220 and 222.

The size of opening 218 in routing layer 214 may be similar to the diameter of solder ball pad 247 (as shown by the two dotted lines in FIG. 2). In one embodiment, the diameter of opening 218 is at least half of the diameter of solder ball pad 247. Alternatively, the size of opening 218 is twice the size of the diameter of solder ball pad 247 to fully eliminate the capacitance arising from fringing electrical fields between routing layers 210, 212 and 214 and solder ball pad 247. In one exemplary embodiment, opening 218 has a diameter of 635 um. Opening 218 may be a circular opening, a rectangular opening, an octagonal opening, a pentagonal opening or a hexagonal opening in ground layer 219.

In FIG. 2, signal conductor 217 may be formed in the middle of opening 218. Signal conductor 217 may be coupled to conductive via 222 and conductive via 220. The size of signal conductor 217 may depend on the number of conductive vias, such as conductive vias 220 and 222, coupled to signal conductor 217. Therefore, as shown in FIG. 2, signal conductor 217 in routing layer 214 may have a smaller size compared to signal conductor 217 in routing layer 212.

Figure 3:
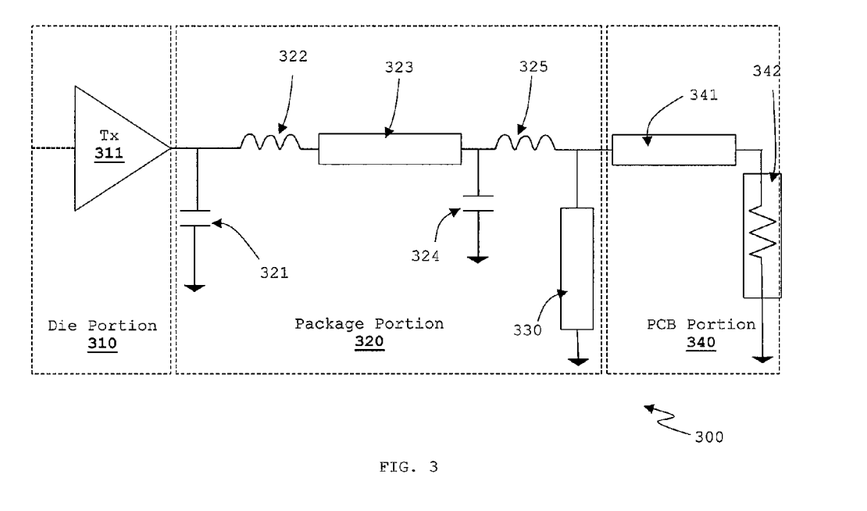
FIG. 3 shows a circuit diagram representing different parts of an integrated circuit package in accordance with one embodiment of the present invention.

FIG. 3, meant to be illustrative and not limiting, illustrates a circuit-model representing different parts of an integrated circuit package in accordance with one embodiment of the present invention. Circuit 300 includes die portion 310, package portion 320 and PCB portion 340. In one instance, die portion 310 may represent die 140 of FIG. 1, package portion 320 may represent package bump 147, substrate 110, and ball 117 of FIG. 1, and PCB portion 340 may represent PCB 130 of FIG. 1. Signals may be transmitted from transmitter 311 to a load 342 in PCB portion 340.

Package portion 320 can be represented as capacitors 321 and 324, inductors 322 and 325, transmission line 323 and impedance block 330. Capacitor 321 represents the electrical capacitance between a signal bump (e.g., bump 142 of FIG. 1) pad and the ground plane. Inductor 322 represents the inductance arising from the traces and vias in the package substrate.

Still referring to FIG. 3, transmission line 323 may represent a package trace on the package substrate. In one embodiment, the package trace may have a differential characteristic impedance of 100 Ohms. Inductor 325 and capacitor 324 may represent the plurality of conductive via structures (e.g., PTH and conductive vias 220-223 of FIG. 2) within the package substrate. Accordingly, impedance block 330 may represent the coupling effects between ball pad 247 and routing layer 210 to 214, including ground planes 219, openings 218 of FIG. 2 and structures formed within opening 218. Hence, impedance block 330 may vary in terms of its circuit representation. In one instance, impedance block 330 may include a plurality of capacitors and/or inductors. For example, impedance block 330 may be similar to circuits shown in impedance block 330 of FIGS. 4B, 5B, 6B and 7B based on the respective structures of routing layers 400-700 in FIGS. 4A, 5A, 6A and 7A.

In the embodiment of FIG. 3, PCB portion 340 is represented by transmission line 341 and resistor 342. Transmission line 341 may represent a PCB trace. In one embodiment, transmission line 341 may have a differential characteristic impedance of 100 Ohm. Resistor 342 may represent a load circuit on the PCB.

Figure 4A:
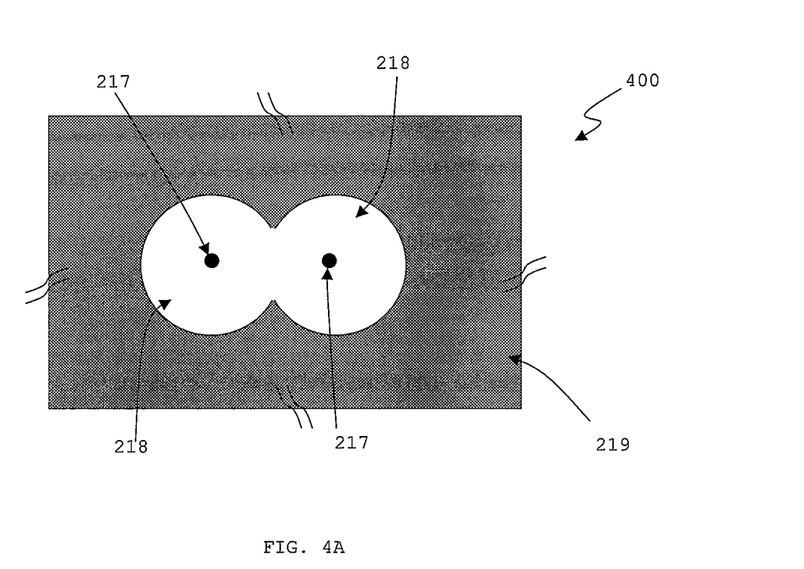
FIG. 4A shows a portion of a routing layer with two circular openings in accordance with one embodiment of the present invention.

FIG. 4A, meant to be illustrative and not limiting, shows a portion of a routing layer with two circular openings in accordance with one embodiment of the present invention. In one embodiment, a structure similar to routing layer 400 may be implemented on any of routing layers 210, 212 and 214 of FIG. 2. Routing layer 400 includes ground plane 219, two openings 218 and two signal conductors 217. It should be appreciated that, though not shown in FIG. 4A, there may be other structures (e.g., package traces and spiral inductors) built within the routing layer, but outside of openings 218.

In FIG. 4A, ground plane 219 covers routing layer 400 except for the regions where the two openings 218 are located. In one instance, openings 218 may be circular in shape. In other instances, openings 218 may have different shapes such as rectangular, triangular, octagonal, pentagonal or hexagonal.

The diameter of an opening, such as openings 218 in routing layer 400, may affect the electrical capacitance formed between a solder ball pad (e.g., solder ball pad 247 of FIG. 2) and ground plane 219. In one exemplary embodiment, opening 218 on routing layer 214 (or routing layers 210 and 212) of FIG. 2 may have a diameter larger than or equal to the diameter of solder ball pad 247 of FIG. 2 in order to have a relatively low electrical capacitance.

Positions of openings 218 on the respective routing layers 210, 212 and 214 may also affect the electrical capacitances. In one embodiment, openings 218 that are located directly above (or substantially aligned to) solder ball pad 247 of FIG. 2 may have small electrical capacitances.

Figure 4B:
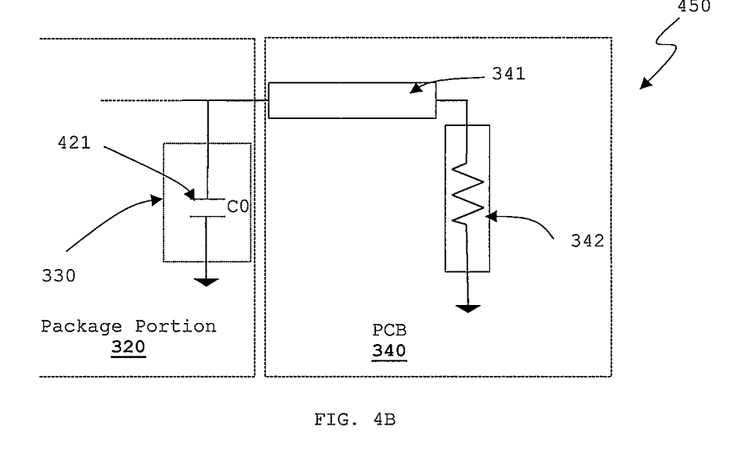
FIG. 4B shows a circuit representation of a routing layer of the type shown in FIG. 4A in accordance with one embodiment of the present invention.

FIG. 4B shows a circuit representation of routing layer 400 of FIG. 4A. Within package portion 320, impedance block 330 includes capacitor 421. PCB portion 340 is similar to PCB portion 340 of FIG. 3, and therefore will not be repeated in here again. In one embodiment, capacitor 421 has a capacitance value of C0. The value C0 may depend on a number of factors such as the diameter of the opening and the number of routing layers having a similar structure as that shown in routing layer 400 of FIG. 4A. In one instance, the capacitance value, C0, is inversely proportional to the area of the opening and the number of routing layers that share the same structure as that of routing layer 400 of FIG. 4A. Therefore, when all or a significantly high number of routing layers (e.g., all of routing layers 210, 212 and 214 of FIG. 2) implement a similar design to the one shown in routing layer 400 of FIG. 4A, the capacitance value, C0, may be relatively low.

It should be appreciated that having any form of capacitance on a transmission path may affect the return loss (RL) and insertion loss (IL) in the path. A large capacitance value may degrade the signal performance as it propagates through the package substrate. This is because the large capacitance value may increase the reflection of the signal as it propagates through the package substrate.

In one embodiment, a signal transmission path may have a differential return loss of −5 dB at 25 gigahertz (GHz) when its routing layer (e.g., routing layer of 214 of FIG. 2) is similar to routing layer 400 of FIG. 4A. Alternatively, a signal transmission path may show a differential return loss of −33 dB at 25 GHz when all routing layers below the core (e.g., routing layers 210, 212 and 214 of FIG. 2) in the package substrate are similar to routing layer 400 of FIG. 4A. In one embodiment, having more routing layers such as routing layer 400 of FIG. 4A in a package substrate may provide a good differential return loss for a signal transmission path. A signal transmission path may have a differential insertion loss of −1 dB at 25 GHz when all routing layers below the core (e.g., routing layers 210, 212 and 214 of FIG. 2) implement the design as shown in routing layer 400 of FIG. 4A.

Figure 5A:
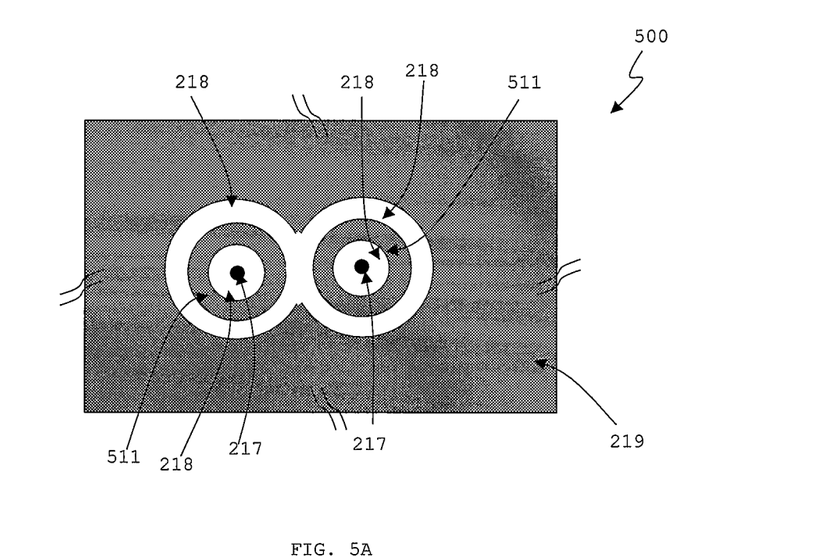
FIG. 5A shows a portion of a routing layer with two circular rings surrounding their respective conductive signal conductors in accordance with one embodiment of the present invention.

FIG. 5A, meant to be illustrative and not limiting, illustrates a portion of a routing layer with two circular rings surrounding their respective conductive signal areas in accordance with one embodiment of the present invention. Routing layer 500 may be similar to routing layer 400 of FIG. 4A with additional circular rings 511 surrounding respective signal conductors 217. In one embodiment, routing layer 500 may be any of the routing layers 210, 212 and 214 shown in FIG. 2.

In FIG. 5A, circular rings 511 may be electrically decoupled from a signal transmission pathway. Hence, circular rings 511 may be known as electrically "floating" structures. Furthermore, circular rings 511 may be made up of similar materials as ground plane 219 or signal conductors 217 (e.g., copper). In one embodiment, routing layer 500 may have a better copper distribution compared to routing layer 400 of FIG. 4A. Given a fixed amount of copper material for distribution, the additional circular rings 511 inside of opening 218 may decrease the level of concentration for copper when forming ground plane 219, which in return may provide a better control on the distribution of copper in the routing layer.

Figure 5B:
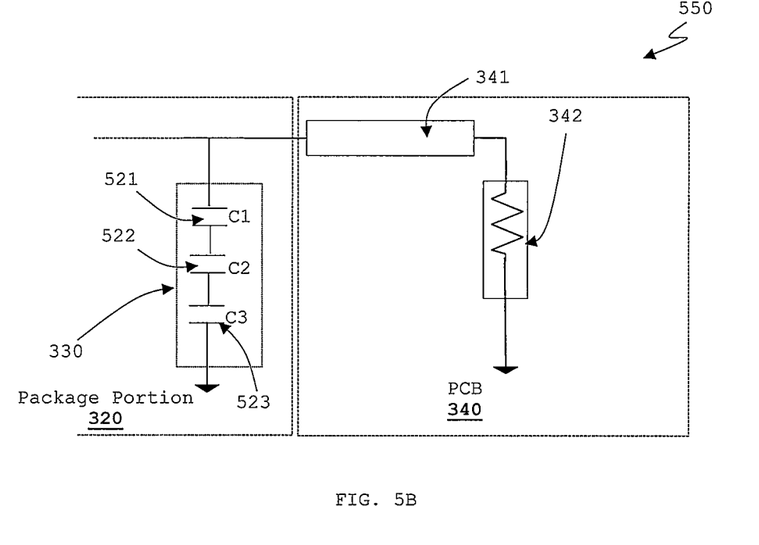
FIG. 5B shows a circuit representation of a routing layer of the type shown in FIG. 5A in accordance with one embodiment of the present invention.

FIG. 5B shows a circuit model representation of routing layer 500 of FIG. 5A. Impedance block 330 in circuit 550 includes capacitors 521-523. Capacitors 521-523 may have their respective capacitance values at C1, C2 and C3. The capacitance values of C1, C2 and C3 may represent different electric couplings between the ground plane 219, signal conductors 217, circular rings 511 and solder ball pad 247 of FIG. 2. For example, the capacitance value C1 may represent the electric coupling between solder ball pad 247 and circular ring 511 on layer 214 of FIG. 2. The capacitance value C2 may represent the electric coupling between circular ring 511 on layer 214 and circular ring 511 on layer 212 of FIG. 2 and the capacitance value C3 may represent the electric coupling between circular ring 511 and ground plane 219.

In one embodiment, capacitors 521-523 are coupled in series. Capacitors 521-523 are coupled in series because the electrical couplings between ground plane 219, circular rings 511 and solder ball pad 247 of FIG. 2 provide serial capacitances. The C1, C2 and C3 values should be smaller than the value of 330 in FIG. 3 and the total capacitance due to the serially coupled capacitors 521-523 is even smaller than the smallest capacitance value among 521-523. In one embodiment, circuit 550 has a differential return loss of −16 dB at 25 GHz and a differential insertion loss of −1.6 dB at 25 GHz, compared to original −3 dB return loss and −6.8 dB insertion loss at same frequency without additional openings on ground planes.

Figure 6A:
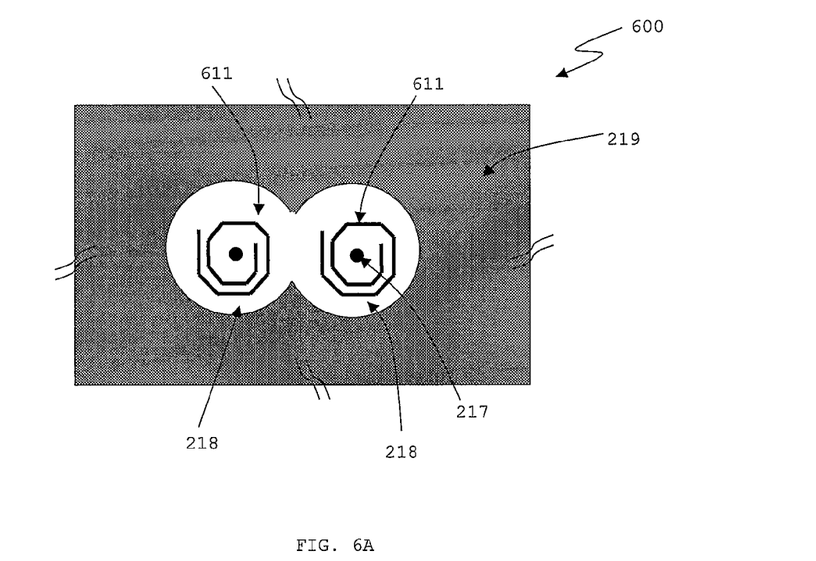
FIG. 6A shows two spiral inductors each surrounding a respective conductive signal conductor in accordance with one embodiment of the present invention.

FIG. 6A, meant to be illustrative and not limiting, illustrates two spiral inductors with each spiral inductor surrounding their respective conductive signal areas in accordance with one embodiment of the present invention. In one embodiment, routing layer 600 may be similar to routing layer 400 of FIG. 4A, but with two spiral inductors 611 filling the void areas.

Routing layer 600 may represent any routing layer (e.g., routing layers 210, 212 and 214) in package substrate 110 of FIG. 2. Spiral inductors 611 may be electrically decoupled from signal conductors 217 and ground plane 219. Spiral inductors 611 may be composed of similar materials as ground plane 219 or signal conductors 217 (e.g., copper). Furthermore, routing layer 600 may have a copper distribution similar to that of routing layer 500 of FIG. 5A.

In FIG. 6A, spiral inductors 611 have two turns and twelve segments. It should be appreciated that the segments may refer to a location on a trace where it changes from one direction to another direction. In FIG. 6A, an angle between two segments in spiral inductors 611 may be approximately 120 degree. Therefore, spiral inductors 611 may be referred to as octagonal spiral inductors. However, spiral inductors 611 may be of other shapes, for example, circular, rectangular, hexagonal, heptagonal or pentagonal.

The number of turns in spiral inductors 611 may vary depending on the value of inductance required from spiral inductors 611. In one instance, the number of turns in spiral inductors 611 may be proportional to the inductance generated by spiral inductor 611. For example, in order to obtain a high inductance, spiral inductors 611 may be designed to have more than two turns each.

Figure 6B:
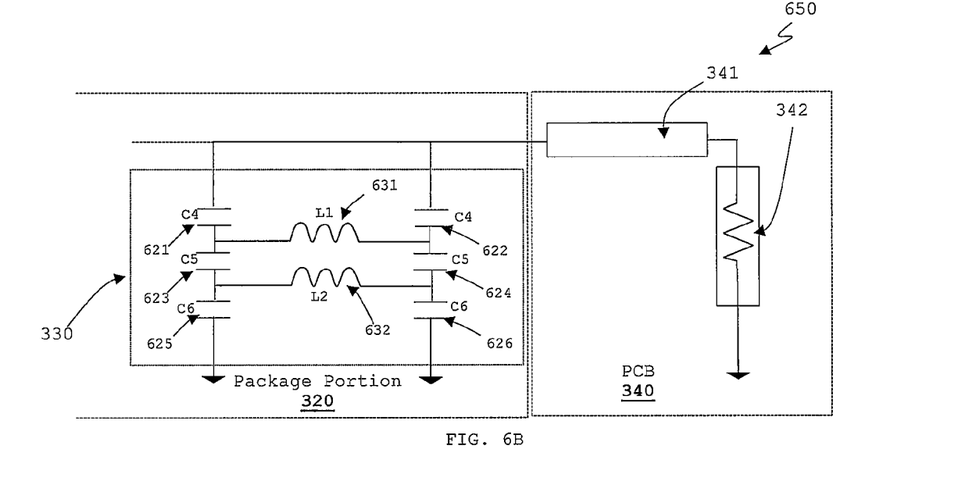
FIG. 6B shows a circuit representation of a routing layer of the type shown in FIG. 6A in accordance with one embodiment of the present invention.

FIG. 6B shows a circuit model representation of routing layer 600 of FIG. 6A. Impedance block 330 in circuit 650 includes capacitors 621-626 and inductors 631 and 632. In FIG. 6B, capacitors 621 and 622 may have a capacitance of C4, capacitors 623 and 624 may have a capacitance of C5 and capacitors 625 and 626 may have a capacitance of C6.

In one embodiment, capacitors 621 and 622 may be formed as a result of the electric coupling between solder ball pad 247 of FIG. 2 and spiral inductor on layer 214 of FIG. 2. Capacitors 623 and 624 may be formed as a result of the electric coupling between spiral inductor on layer 214 and spiral inductor on layer 212 of FIG. 2 . . . . Capacitors 625 and 626 may be formed as a result of the electric coupling between ground plane 219 of FIG. 6A and spiral inductor 611 of FIG. 6A.

In FIG. 6B, inductors 631 and 632 may have inductance values of L1 and L2, respectively. Inductors 631 and 632 may be inductors where their inductance values, L1 and L2, depend on a number of factors (e.g., the number of turns formed within the spiral inductor and the shape of the spiral inductor). It should be appreciated that the differential return loss and the differential insertion loss of a signal transmission path may change when the inductance values, L1 and L2, are changed. Therefore, changing the structure or design of a spiral inductor such as spiral inductors 611 may change the differential return loss and the differential insertion loss of a signal transmission path. As a result, the bandwidth of a package frequency response can be adjusted according to practical system operation frequency.

In one embodiment, circuit 650 has a differential return loss −10 dB at 25 GHz and a differential insertion loss of −2.2 dB at 25 GHz, compared to original −3 dB return loss and −6.8 dB insertion loss at same frequency without any opening scheme on ground planes.

Figure 7A:
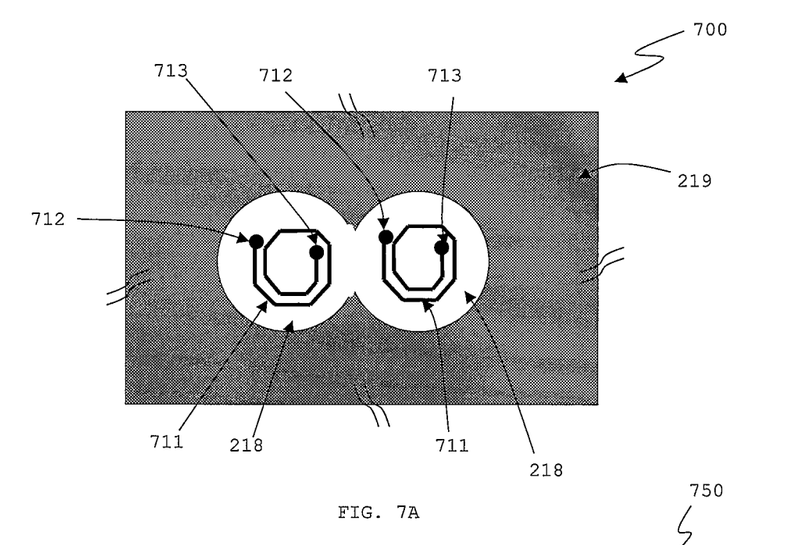
FIG. 7A shows a portion of a routing layer with two spiral inductors each having ends coupled to different conductive vias in accordance with one embodiment of the present invention.

FIG. 7A, meant to be illustrative and not limiting, shows a portion of a routing layer with two spiral inductors with each spiral inductor having their ends coupled to different conductive vias in accordance with one embodiment of the present invention. Routing layer 700 includes two spiral inductors 711, each with two ends, 712 and 713. The two ends 712 and 713 may be coupled to two conductive vias (e.g., conductive vias 220 and 222 of FIG. 2). In one embodiment, routing layers 210, 212 and 214 of FIG. 2 may be similar to routing layer 700.

In FIG. 7A, spiral inductors 711 have two turns and twelve segments, with an angle of 120 degrees between each segment. Therefore, spiral inductors 711 may be referred to as octagonal spiral inductors. Spiral inductors 711 may be of other shapes (e.g., circular, rectangular, pentagonal, heptagonal or hexagonal).

Figure 7B:
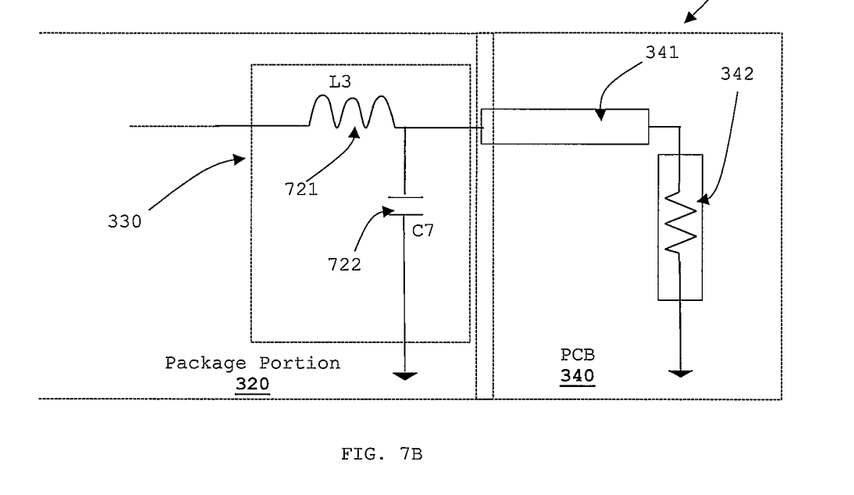
FIG. 7B shows a circuit representation of a routing layer of the type shown in FIG. 7A in accordance with one embodiment of the present invention.

FIG. 7B shows a circuit model representation of routing layer 700 of FIG. 7A. Impedance block 330 in circuit 750 includes inductor 721 and capacitor 722. Inductor 721 may represent the magnetic field when a signal flows from end 712 to end 713 of spiral inductor 711. Inductor 721 has an inductance value of L3, which may depend on a number of design factors (e.g., the number of turns within the spiral inductor and the shape of the spiral inductor). Therefore, similar to inductor 631 and 632 of FIG. 6B, different structures of spiral inductors 711 may alter the inductance value L3 of inductor 721, which may alter the differential return loss and the differential insertion loss responses. As a result, the bandwidth of a package frequency response can be adjusted according to practical system operation frequency. In one embodiment toward 32 Gbps data application, circuit 750 may have a differential return loss of −20 dB at 16 GHz and a differential insertion loss of −1.2 dB at 16 GHz.

Figure 8A:
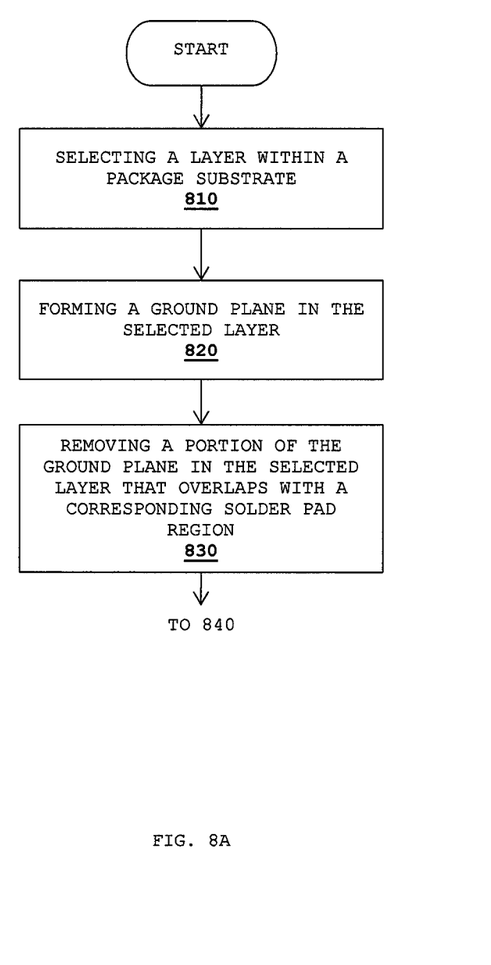
FIGS. 8A and 8B show methods of manufacturing a package substrate in accordance with one embodiment of the present invention.
Figure 8B:
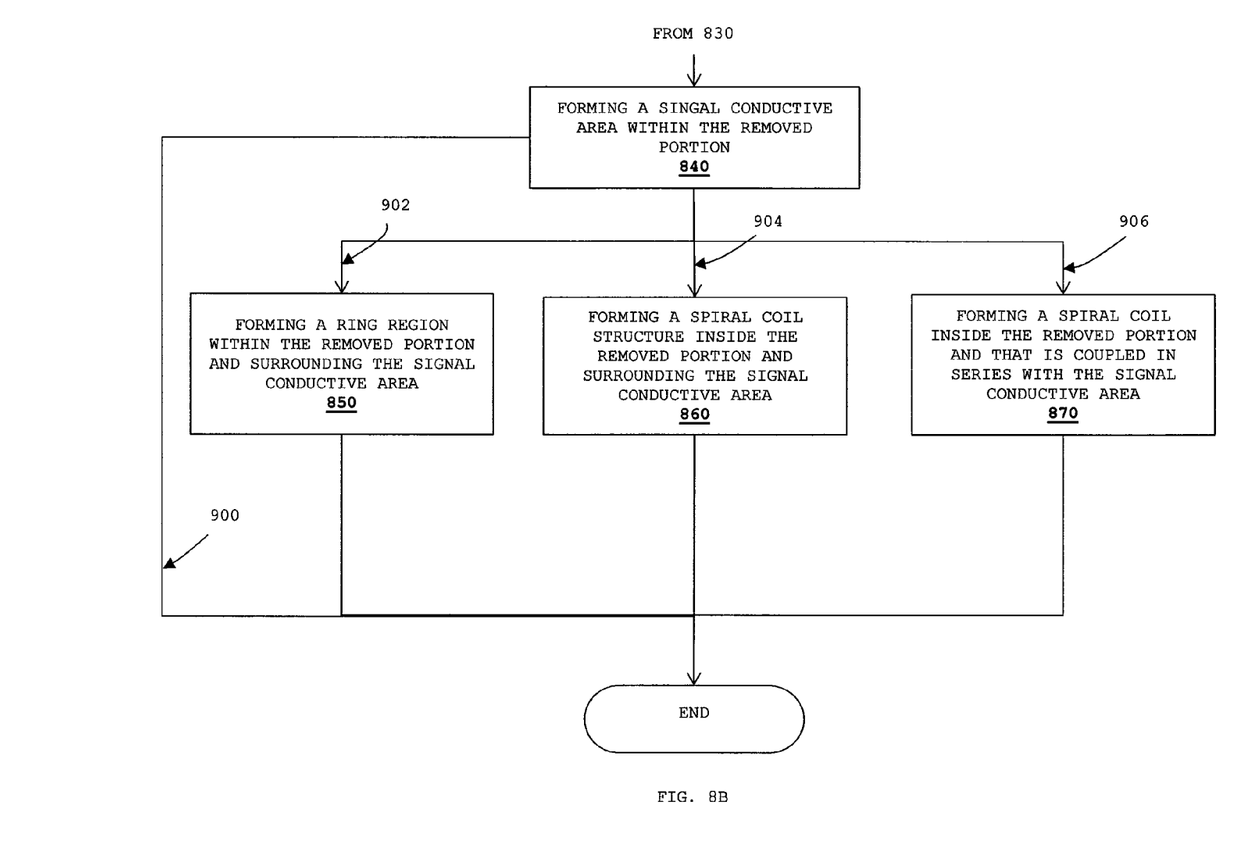

FIGS. 8A and 8B, meant to be illustrative and not limiting, shows a method for manufacturing a package substrate in accordance with one embodiment of the present invention. FIG. 8A shows the steps to form an opening in a layer of the package substrate while FIG. 8B shows the steps to form a routing layer similar to the routing layer shown in either FIG. 4A, 5A, 6A or 7A. In one embodiment, the package substrate may be similar to package substrate 110 of FIG. 2. The package substrate may be a multi-layered package substrate. At step 810, a layer within the package substrate may be selected. In one instance, the selected layer is one of the routing layers below the core layer (e.g., routing layers 210, 212 or 214 of FIG. 2) in the package substrate.

At step 820, a ground plane may be formed on the selected layer. In one instance, the ground plane may be similar to ground plane 219 of FIG. 2. The ground plane may cover the entire routing layer or may cover a portion of the routing layer, depending on different design requirements. The ground plane may be made of conductive materials (e.g., copper) and may be formed via a deposition process.

At step 830, a portion of the ground plane is removed to form an opening. In one embodiment, the opening in the ground region may be similar to opening 218 of FIG. 2. The portion of ground plane that is removed may be larger than or of the same size as the diameter of a solder ball pad such as solder ball pad 247 of FIG. 2. It should be appreciated that the portion of ground region may be removed through an etching process. The removed portion may be in various shapes, for example, circular, rectangular, pentagonal, heptagonal, hexagonal and octagonal shapes.

The method may then continue in FIG. 8B. At step 840, a signal conductive area may be formed within the removed portion of the ground plane. In one embodiment, the signal conductive area may be similar to signal conductor 217 of FIG. 2. The signal conductive area may be composed of the same material as the ground region.

Upon completion of step 840, a layer similar to routing layer 400 of FIG. 4A may be formed. If the intended design is similar to the routing layer 400 of FIG. 4A, the method may end after step 840, as shown by arrow 900.

If the desired layer structure is similar to routing layer 500 of FIG. 5A, the method may continue at step 850 as shown by arrow 902. At step 850, a ring region surrounding the signal conductive area may be formed within the removed portion of the ground plane. The ring region formed at step 850 may be similar to routing layer 500 of FIG. 5A.

Alternatively, if the desired layer structure is similar to routing layer 600 of FIG. 6A, the method may continue at step 860, as shown by arrow 904. At step 860, a spiral coil structure that surrounds the conductive area may be formed within the removed portion of the ground plane. The resulting layer formed after completing step 860 may be similar to routing layer 600 of FIG. 6A.

If the desired layer is similar to routing layer 700 of FIG. 7A, the method may continue at step 870, as shown by arrow 906. At step 870, a spiral coil may be formed within the removed portion of the ground region. The spiral coil may be coupled in series with two conductive via structures. After completing step 860, the resulting layer structure may be similar to routing layer 700 of FIG. 7A.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

Although the foregoing invention has been described in some detail for the purposes of clarity, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit package, comprising:
   a package substrate having first and second surfaces;
   an integrated circuit mounted on the first surface of the package substrate;
   a solder ball pad located on the second surface of the package substrate, wherein a gap in the second surface of the package substrate surrounds the solder ball pad, wherein the solder ball pad has a diameter, and wherein the package substrate includes a layer comprising:
   a ground plane; and
   an opening formed through the ground plane above the solder ball pad, wherein the opening has a diameter that is at least equal to half the diameter of the solder ball pad.

2. The integrated circuit package as defined in claim 1, wherein the layer further comprises:
   a conductive interconnect formed within the opening and coupled to the integrated circuit.

3. The integrated circuit package as defined in claim 2, wherein the layer further comprises:
   a ring shaped structure that surrounds the conductive interconnect within the opening.

4. The integrated circuit package as defined in claim 2, wherein the layer further comprises:
   a spiral coil structure that surrounds the conductive interconnect within the opening.

5. The integrated circuit package as defined in claim 1, wherein the opening is at least partially aligned with the solder ball pad.

6. The integrated circuit package as defined in claim 1, wherein the package substrate further comprises:
   another layer formed above the layer, wherein the another layer comprises:
   another ground plane; and
   another opening formed within the another ground plane.

7. The integrated circuit package as defined in claim 1, wherein a shape for the opening in the ground plane is selected from one of: a circular shape, a rectangular shape, an octagonal, a pentagonal shape, and a hexagonal shape.

8. The integrated circuit package as defined in claim 1, wherein the diameter of the opening is twice the diameter of the solder ball pad.

9. The integrated circuit package as defined in claim 1, wherein the layer further comprises:
   a conductive via formed within the opening;
   another opening formed within the ground plane; and
   another conductive via formed within the another opening that is coupled to the integrated circuit, wherein the conductive via and the another conductive via transmit differential signals.

10. An integrated circuit package, comprising:
    a package substrate having a first surface and a second surface;
    an integrated circuit that is mounted on the first surface of the package substrate; and
    a solder ball coupled to the second surface of the package substrate through a solder ball pad, wherein the solder ball pad is surrounded by a gap in the second surface, wherein the solder ball has a diameter, and wherein the package substrate includes a layer in the substrate comprising:
    a ground plane;
    an opening within the ground plane, wherein the opening has a diameter that is at least equal to half the diameter of the solder ball pad; and
    a spiral coil structure that is formed within the opening.

11. The integrated circuit package as defined in claim 10, wherein a shape of the spiral coil structure is selected from one of: a circular shape, a rectangular shape, an octagonal shape, a pentagonal shape, and a hexagonal shape.

12. The integrated circuit package as defined in claim 10, wherein the layer further comprises:
    another opening within the ground plane, wherein the other opening is located adjacent to the opening; and
    another spiral coil structure formed within the other opening and is coupled in series between the integrated circuit and another solder ball, wherein the spiral coil structure and the another spiral coil structure convey differential signals.

13. The integrated circuit as defined in claim 10, wherein the spiral coil structure is coupled in series between the integrated circuit and the solder ball.

14. The integrated circuit package as defined in claim 10, wherein the package substrate further comprises:
- another layer within the substrate that is located above the substrate layer and are separated by a dielectric layer, wherein the another layer includes another opening that substantially overlaps with the opening of the ground plane, and wherein both the substrate layers are coupled together by a plurality of conductive interconnects within the dielectric layer.

15. A method of manufacturing an integrated circuit package having an integrated circuit mounted on a first surface of a package substrate, comprising:
- forming a ground plane in the package substrate;
- forming a solder pad region on a second surface of the package substrate, wherein the second surface is adjacent to the ground plane;
- forming a gap in the second surface of the package substrate that surrounds the solder pad region; and
- forming a hole in the ground plane, wherein the hole overlaps with at least half of the solder pad region.

16. The method as defined in claim 15, further comprising:
- forming a conductive interconnect that is coupled to the solder pad region inside of the hole.

17. The method as defined in claim 16, further comprising:
- forming a conductive ring region to surround the conductive via within the hole.

18. The method defined in claim 16, further comprising:
- forming a spiral coil structure to surround the conductive via within the hole.

19. The method defined in claim 15, further comprising:
- forming a spiral coil structure within the hole, wherein one end of the spiral coil structure is coupled to a conductive interconnect coupling the integrated circuit and another end of the spiral coil structure is coupled to another conductive interconnect that is coupled to the solder pad region.

* * * * *